(12) United States Patent
Park

(10) Patent No.: US 6,469,947 B2
(45) Date of Patent: Oct. 22, 2002

(54) SEMICONDUCTOR MEMORY DEVICE HAVING REGIONS WITH INDEPENDENT WORD LINES ALTERNATELY SELECTED FOR REFRESH OPERATION

(75) Inventor: Jong Tai Park, Seoul (KR)

(73) Assignee: Hyundai Electronics Co., Ltd., Kyoungki-do (KR)

( * ) Notice: Subject to any disclaimer, the term of this patent is extended or adjusted under 35 U.S.C. 154(b) by 0 days.

(21) Appl. No.: 09/846,778

(22) Filed: May 2, 2001

(65) Prior Publication Data

US 2002/0002696 A1 Jan. 3, 2002

Related U.S. Application Data

(63) Continuation-in-part of application No. 09/599,465, filed on Jun. 22, 2000, now Pat. No. 6,246,631.

(30) Foreign Application Priority Data

Jun. 29, 1999 (KR) .............................................. 99-25354

(51) Int. Cl.[7] .................................................. G11C 7/00
(52) U.S. Cl. ............. 365/222; 365/230.03; 365/230.06; 365/230.08
(58) Field of Search ........................... 365/222, 230.03, 365/230.04, 230.06, 230.08

(56) References Cited

U.S. PATENT DOCUMENTS

| | | | |
|---|---|---|---|
| 4,393,476 A | 7/1983 | Ong ............................ | 365/203 |
| 5,243,557 A | 9/1993 | Maeda et al. ................ | 365/177 |
| 5,313,423 A | 5/1994 | Sato et al. ................... | 365/200 |
| 5,414,660 A | 5/1995 | Sugibayashi et al. ........ | 365/200 |
| 5,416,748 A | 5/1995 | Fujita ..................... | 365/230.06 |
| 5,539,698 A | 7/1996 | Suzuki ........................ | 365/200 |
| 5,596,542 A | 1/1997 | Sugibayashi et al. .. | 365/230.06 |
| 5,608,683 A * | 3/1997 | Kim ............................ | 365/190 |
| 5,864,496 A | 1/1999 | Mueller et al. ................ | 365/69 |
| 5,889,712 A | 3/1999 | Sugibayashi ................ | 365/200 |
| 6,038,634 A | 3/2000 | Ji et al. ......................... | 711/5 |
| 6,049,502 A | 4/2000 | Cowles et al. ......... | 365/230.03 |
| 6,064,605 A | 5/2000 | Muranaka et al. .......... | 365/190 |
| 6,064,619 A | 5/2000 | Ahn et al. .............. | 365/230.03 |
| 6,246,631 B1 | 6/2001 | Park ....................... | 365/230.06 |

* cited by examiner

*Primary Examiner*—Richard Elms
*Assistant Examiner*—VanThu Nguyen
(74) *Attorney, Agent, or Firm*—Nath & Associates PLLC; Gary M. Nath; Marvin C. Berkowitz

(57) ABSTRACT

A semiconductor memory device is provided to reduce current consumption during a refresh operation by decreasing the number of wordlines activated at the same time, including a block set having a plurality of cell array blocks which are divided into a plurality of regions which employ wordlines independently from each other, row driving circuit to alternatively select the wordlines arranged each in the regions, and column driving circuit to activate columns of the cell arrays involved in the wordlines selected by the row driving circuit.

10 Claims, 7 Drawing Sheets

SEMICONDUCTOR MEMORY DEVICE HAVING REGIONS WITH INDEPENDENT WORD LINES ALTERNATELY SELECTED FOR REFRESH OPERATION

This application is a continuation-in-part application of U.S. patent application Ser. No. 09/599,465 filed Jun. 22, 2000, now U.S. Pat. No. 6,246,631 the entire content of which are hereby incorporated in their entirety.

FIELD OF THE INVENTION

The present invention generally relates to semiconductor memory devices having refresh functions. The device is operable with double wordline activation in which wordlines belong to different memory blocks of 2N (N is an integer) rows each other are enabled at the same time during a refresh operation for NK (K is $2^{10}$) wordlines.

BACKGROUND OF THE INVENTION

Dynamic random access memory (DRAM) is usually exposed to leakage current flowing its substrate in which memory cells are constructed, and thereby contains weak data retention facility relative to other memory devices. Therefore, it is basically necessary for the DRAM to employ a refresh function that re-writes data into memory cells before losing the data stored in the memory cells. In the refresh operation, data weakly stored in the memory cells are read out therefrom and restored therein after being amplified. The DRAM generally manages the refresh operation with reiterate cycling modes that are conductive by a predetermined time.

The refresh operation starts with transition of row address strobe signal /RAS. from its precharge state of high level to low level, which activates wordlines, and then with activation of sense amplifiers. Memory cells coupled to the selected wordlines are simultaneously refreshed (i.e., their ordinary data are renown).

A cycle of the refresh operation is defined within the period when the row address strobe signal /RAS is laid on low level after receiving addresses for refreshing. The refresh cycle is usually dependent on the number of unit cycles to complete the data renewing for memory cells associated with all of rows in a DRAM, being represented to as the number of wordlines activated to perform the refresh operation for all of memory cells.

Conventional DRAMs are designed with bonding options alternatively adaptable to refresh modes of NK (N is integer; K $2^{10}$ that is the number of wordlines for refreshing) or 2NK. The DRAM is embedded on one of boards associated with the refresh modes of NK and 2NK. The NK refresh mode is programmed into "H" (i.e., high level) while the 2NK is set into "L" (i.e., low level), by means of the bonding option.

Being operable either in the refresh modes of NK or 2NK by the bonding option, the DRAMs are oriented to be conductive with readout/write-in operations according to the 2NK refresh mode as usual.

FIG. 1 illustrates a row chain in conjunction with an architecture of memory array in a general DRAM. The first buffer 10 receives row address signal ADD_2NK and refresh command signal NK-REFRESHB and then converts them into CMOS logic from the external TTL logic. The row address signal ADD_2NK, including its complementary, is to designate block sets BS divided into two, and the refresh command signal NK-REFRESHB enables a refresh mode in the DRAM. The second buffer 12 receives block selection address signals ADD_BLOCK<1:log$_2$n>(n is the number of blocks), including their complementary signals, and converts it into CMOS logic. The third buffer 14 transfers wordline selection address signals ADD_WL<1:2$^i$>0 (i is the number of bits forming thereof), including their complementary signals, into the device with CMOS logic. The wordline selection address signals ADD_WL<1:2$^i$> make one of wordlines belong to a block be activated.

When the refresh command signal NK_REFRESHB is low level, the row address signals ADDX_2NK and ADDXBhd —2NK (the complementary signal of ADDX_2NK) from the first buffer 10 are compressed and set into high levels. The high-level established row address signals ADDX_2NK and ADDXB$_{13}$ 2NK are applied to block control unit 20 together with the block address signals ADDX_BLOCK and ADDXB_BLOCK (the complementary signal of ADDXB_BLOCK) provided from the second buffer 12 through the fourth buffer 16. The block control unit 20 selects an alternative one of 2N blocks B with the row address signal ADD_2NK that has been compressed into a pattern to divide the block sets into two designable sets. The wordline selection address signals ADDX_WL and ADDXB_WL (the complementary signal of ADDX_WL) from the third buffer 14 are applied to decoder 22 through the fifth buffer 18, and then provided to the two blocks B. Main X-decoders MWL_1 through MWL_2n enables wordlines arranged in cell arrays 24a, 24b, 24c, and 24d those are included in the two blocks B.

FIG. 2 shows a pattern of the row address signal ADD_2NK to designate cell arrays of a 2NK block set into two groups each of the groups is 1NK wordlines (N is the number of the cell arrays of a NK block, and K is the number of wordlines of a cell array). The 2NK block set is formed of two NK block sets. Bit patterns of addresses to designate the cell arrays CELL ARRAY1~N are arranged from 00..01 to 11..11. The row address signal ADD-2NK to distinguish the two block sets (i.e., dividing the memory cell array into two groups each of which is 1NK) is assigned to the most significant bit "0" for the first INK block set or "1" for the second INK block set. The rest bits of the address bit arrangement are for the block selection address signals ADD_BLOCK. During the NK refresh mode, as the row address signal ADD_2NK is compressed into a unified bit (or regarded to as an invalid bit), a pair of the cell arrays (one is in the first 1NK block set, and the other is in the second 1NK block set) is selected at the same time by corresponding block addresses ADD_BLOCK. For example, one of the block address, 00..01. activates two of the CELL ARRAY1 of the two 1NK block sets for the NK refresh mode.

As aforementioned, when the refresh modes for NK and 2NK are alternatively operable in the conventional DRAM by employing the bonding option, the number of wordlines enabled in the NK refresh mode becomes twice during read-out and write-in operations because one of address bits (e.g., the ADD_2NK) is rendered to be not utilized therein. Comparing such a feature of the NK refresh mode with that of the 2NK refresh mode, current dissipation in the NK refresh mode is more than two times of that in the 2NK refresh mode due to the doubled number of the wordlines. The enlarged number of the wordlines activated at the same time in the NK refresh mode causes access speed of reading or writing data to be lowered.

SUMMARY OF THE INVENTION

Accordingly, it is a primary object of the invention to provide a semiconductor memory device capable of reducing current consumption during a refresh mode.

It is another object of the invention to provide a semiconductor memory device capable of enhancing data access speed during a refresh operation by reducing the number of wordlines activated at the same time.

For the purpose of achieving the those objects, a semiconductor memory device according to the invention includes a block set having a plurality of cell array blocks which each is divided into a plurality of regions which employ wordlines independently from each other, row driving means to alternatively select the wordlines arranged each in the regions, and column driving means to activate columns of the cell arrays involved in the wordlines selected by the row driving means.

BRIEF DESCRIPTION OF THE DRAWINGS

For a better understanding of the invention, and to show how embodiments of the same may be carried in effect, reference will now be made, by way of example, to the accompanying diagrammatic drawings, in which.

In the figures, the identical reference signs denote like or equivalent parts.

DESCRIPTION OF THE PREFERRED EMBODIMENT

Hereinbelow, applicable embodiments according to the invention will be as follows, with the appended drawings.

Figure 1:
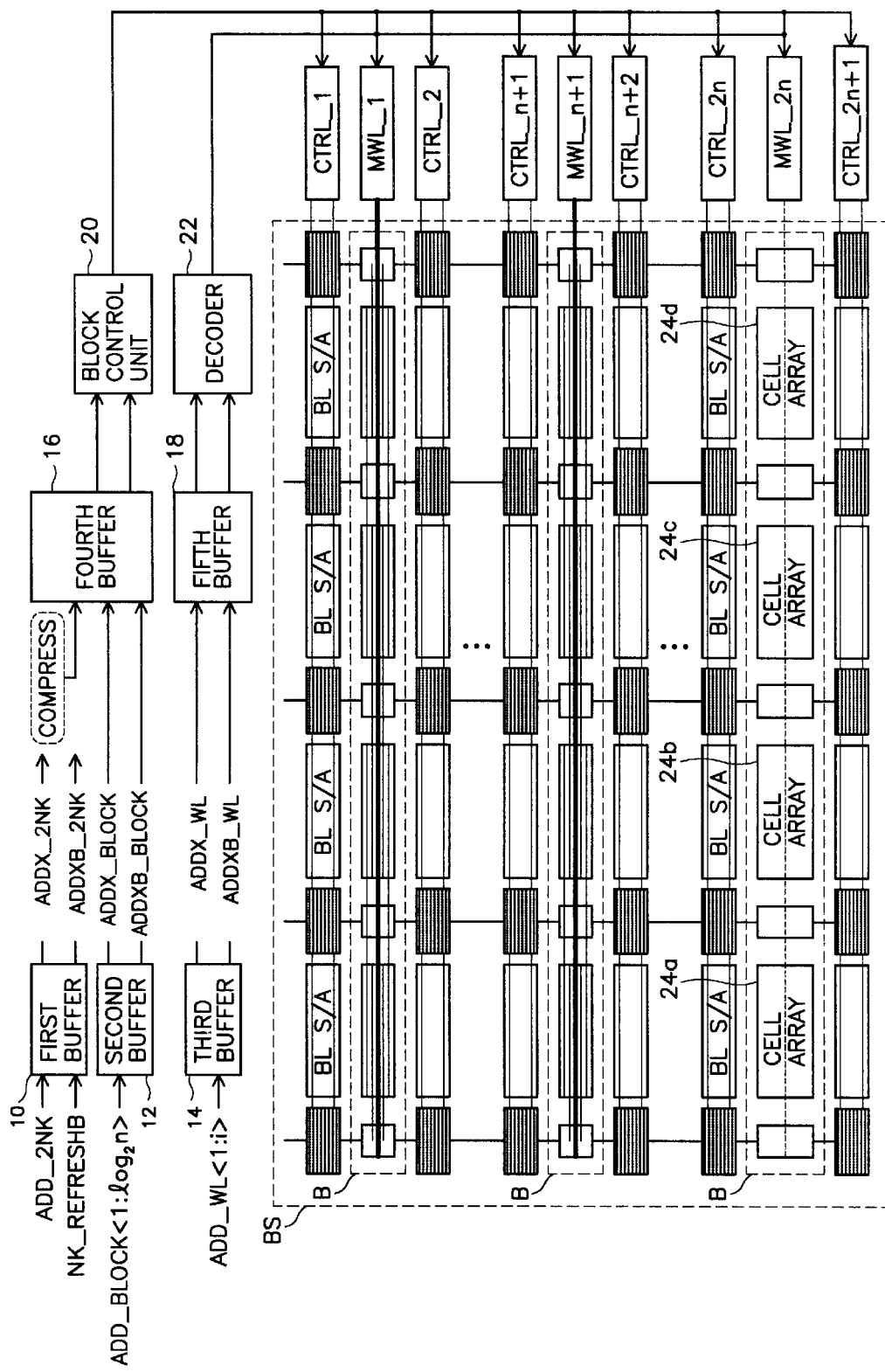
FIG. 1 is a block diagram of a row chain for performing a conventional NK refresh mode in a DRAM.
Figure 2:
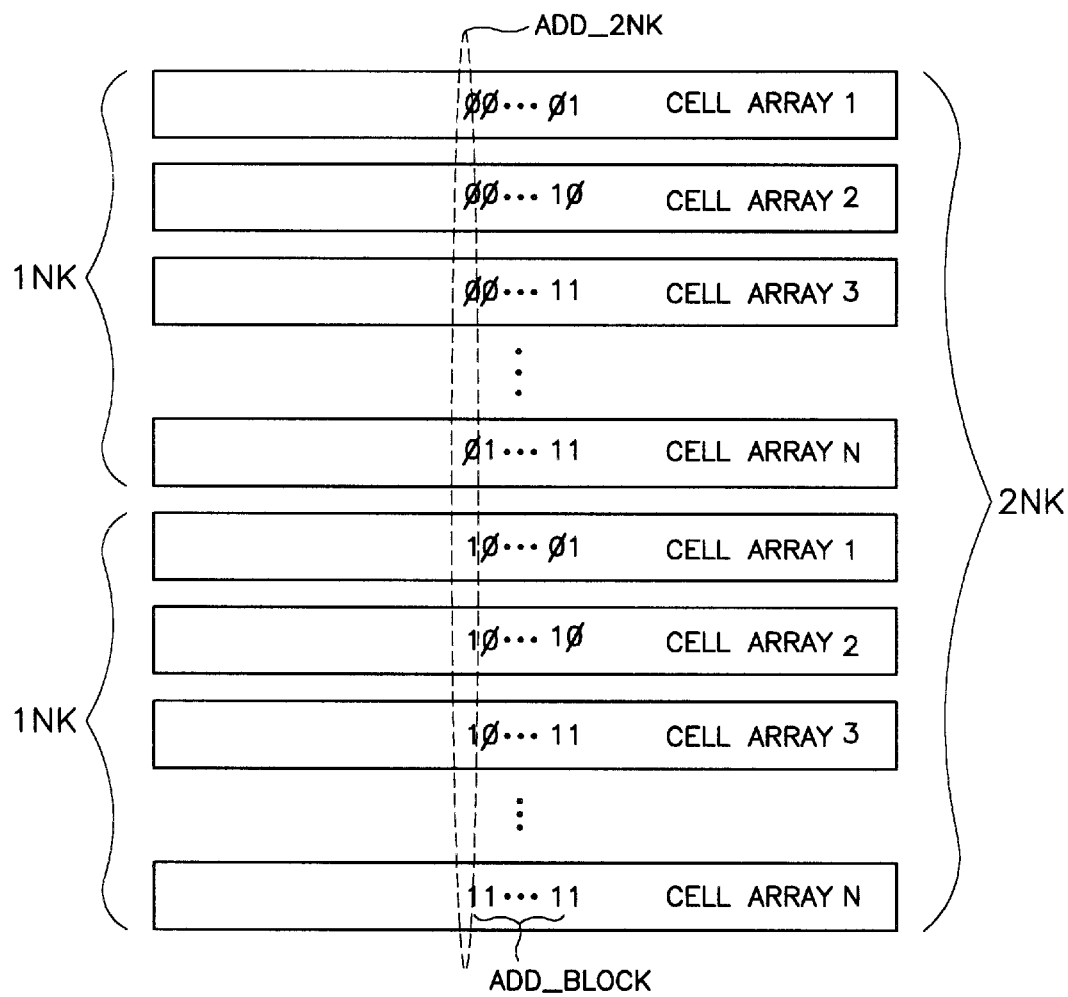
FIG. 2 is a schematic diagram showing a pattern of address signals dividing cell arrays of a conventional 2NK block set into two groups of 1NK block sets.
Figure 3A:
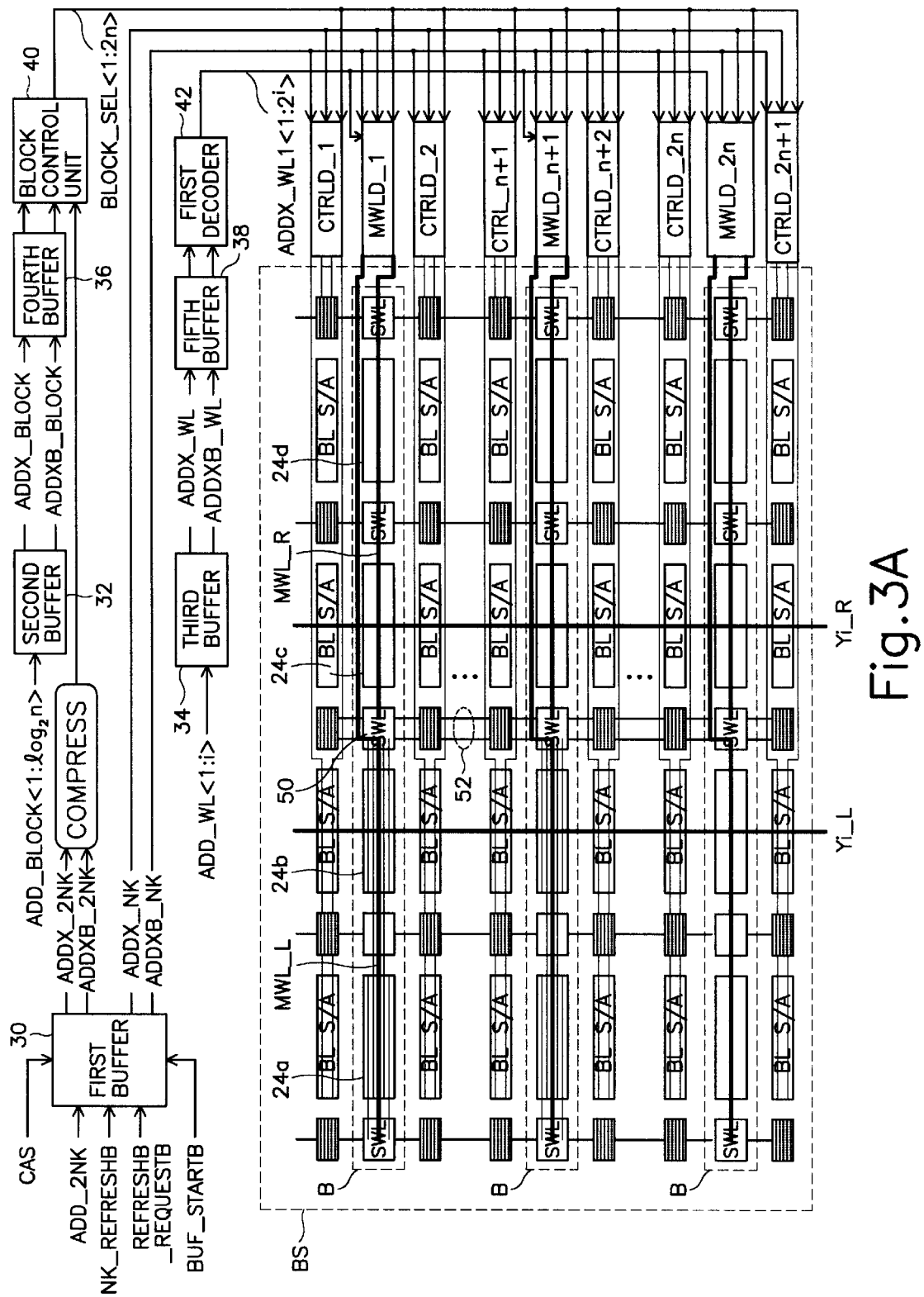
FIGS. 3A and 3B are block diagrams illustrating row and column chains, respectively, according to an embodiment of the invention.
Figure 3B:
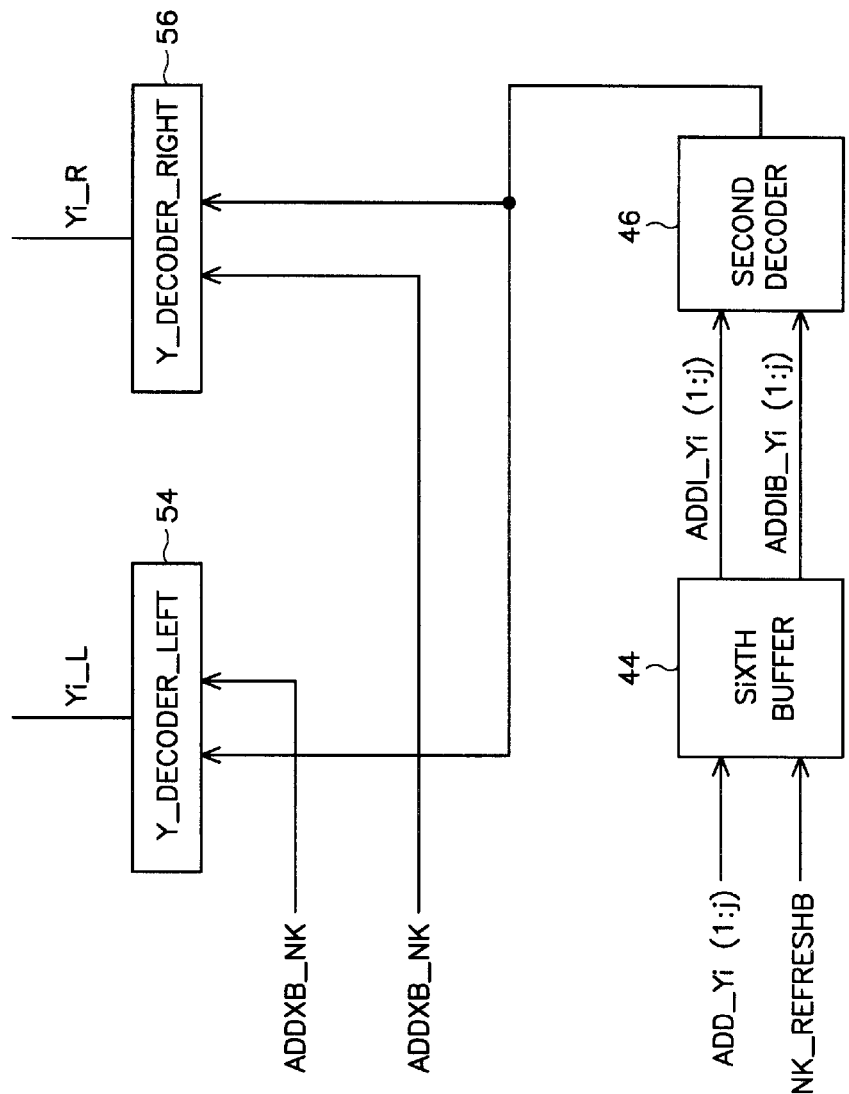

FIGS. 3A shows a row circuit chain for performing a refresh operation while FIG. 3B is for a column chain. Referring to FIG. 3A, block set BS is formed of a plurality of blocks B each of which has a plurality of cell arrays 24$a$, 24$b$, 24$c$, and 24$d$.

The first buffer 30 receives row address signal ADD_2NK for dividing the block sets into two groups of the cell arrays, refresh command signal NK_REFREAHB, and refresh starting signal REFRESH_REQUESTB for informing a beginning of a refresh operation mode, and generates buffer row address signals ADDX_2NK and ADDXB_2NK to be compressed, and NK refresh address signals ADDX_NK and ADDXB_NK (the complementary signal of ADDX_NK) that are not compressed. The refresh address signals ADDX_NK and ADDXB_NK are created independent from the row address signal ADDX_2NK and ADDXB_2NK.

The second buffer 32 receives block selection address signals ADD_BLOCK<1:log$_2$n> and then generates internal block selection address signals ADDX_BLOCK and ADDXB_BLOCK (the complementary signal of ADDX_BLOCK).

The third buffer 34 receives wordline selection address signals ADD_WL<1:i> and then generates internal wordline selection address signals ADDX_WL and ADDXB_WL (the complementary signal of ADDX_WL).

The fourth buffer 36 transfers the internal block selection address signals ADDX_BLOCK and ADDXB_BLOCK to block control unit 40.

The fifth buffer 38 transfers the internal wordline selection address signals ADDX_WL and ADDXB_WL to the first decoder 42 (row decoder or X-decoder).

The block control unit 40, after receiving the compressed row address signals ADDX_2NK and ADDXB_2NK and signals from the fourth buffer 36, selects alternative one of the blocks B, and transfers the signals from the fourth buffer 36 into bitline sense amplifier control units CTRLD_1~CTRLD_2n+1 and main wordline drivers MWLD_1~MWLD_2n.

The bitline sense amplifier control units CTRLD_1~CTRLD_2n+1 selects bitline sense amplifiers BL S/A disposed in the block B designated by the internal block selection signals BLOCK_SEL<1:2n> in response to the address signals ADDX_NK and ADDXB_NK, including bitlines Bish and Bisl.

The main wordline drivers MWLD_1~MWLD_2n receives the internal wordline selection address signals ADDX_WL<1:2$^i$> through the fifth buffer 38 and the first decoder 42, and then selects alternative one of wordlines arranged in left and light sides of a selected block B. The selected one of the left and right main wordlines MWL_L and MWL_R turns on a half of memory cells than that conducted in the convention NK refresh mode but identical to that of the 2NK refresh mode.

The first decoder 42 decodes the address signals supplied from the fifth buffer 38 and then transfers the decoded result into the main wordline drivers MWLD_1~MWLD_2n those are assigned each to their corresponding the blocks B.

The NK refresh address signals ADDX_NK and ADDXB_NK supplied from the first buffer 30. not suppressed, are applied to the bitline sense amplifier control units CTRLD_1~CTRLD_2n+1 and the main wordline drivers MWLD_2~MWLD_2n. The applied NK refresh address signals ADDX_NK and ADDXB_NK select the left cell arrays 24$a$ of the left block B or the right cell arrays 24$c$ and 24$d$ of the right block B. As an example, if the NK refresh address signal ADDX_NK is high level, the left main wordline MWL_L starts to be enable and wordlines are activated one by one with the pitch of NK in accordance with refresh cycles. At this time, the bitline sense amplifiers BL S/A are conductive in correspondence with activation of corresponding cell arrays (e.g., 24$a$ and 24$b$), being coincident with the NK refresh cycles.

In addition, as the cell arrays are segmented into two groups of left and right to be symmetrical at sub wordline drivers 50 positioned along the center column of the cell array region, the left and right groups of the cell arrays, 24$a$ and 24$b$, and 2$c$ and 24$d$, are connected to the main wordline drivers MWLD_1~MWLD_2n independently through the left and right main wordlines MWL_L and MWL_R, respectively. The sub wordline drivers 50 are connected to two of wordline boosting signal (px; Vpp) lines 52 which are assigned each to the left and right cell array groups, 24$a$ and 24$b$, and 24$c$ and 24$d$.

It available for the wordline boosting signal line to prepare one not the two, in which the one wordline boosting line may charge in operation both the left and right cell arrays groups.

The column chain for the refresh mode is in need of being correspondingly adaptable to the row chain shown in FIG. 3B.

Referring to FIG. 3B, the NK refresh mode of the present embodiment employs two column enable signals Yi simultaneously activated per the block set BS. When the refresh command signal NK_REFRESHB is enabled with low level, the sixth buffer 44 receives column address signals ADD–Yi<1:j> for distinguish the most large sections that are divisional with column, and the refresh command signal NK_REFRESHB. Next, the second decoder 46 (column decoder or Y-decoder) receives the buffered column address signals ADDI_Yi<1:j>, ADDIB_Yi<1:j> from the sixth buffer 44 and then generates column address decoding signals for making right and left column enable signals Yi_R and Yi_L. Left and right column decoder (or Y_decoders_left and right), 54 and 56, generates the right and left column enable signals Yi_R and Yi_L in response to the column address decoding signals supplied from the second decoder 46.

The left and right column enable signals, Yi_L and Yi_R, are conducted at a part associated with the left and right main wordlines MWL_L and MWL_R in order to turn on a corresponding column circuit (e.g., a column gate circuit). The left column enable signal Yi_L activates column lines to access data of memory cells coupled to the left main wordline MWL_L, while the right column enable signal Yi_R activates column lines to access data of memory cells coupled to the right main wordline MWL_R.

Figure 4:
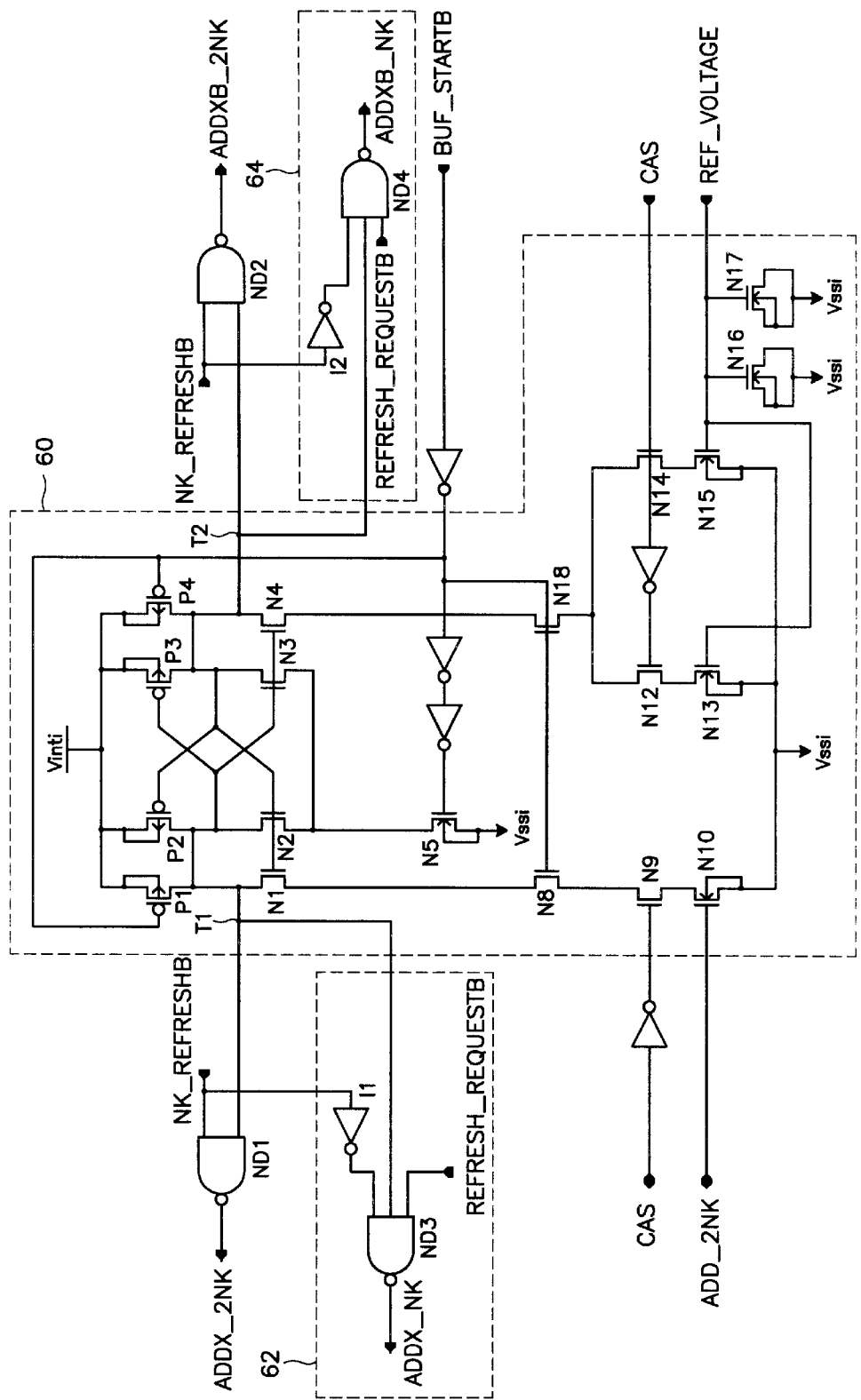
FIG. 4 is a circuit diagram of the first buffer shown in FIG. 3A.

The first buffer shown in FIG. 3A, referring to FIG. 4, is constructed of differential amplifier 60, NAND gates ND1 and ND2, logic circuits 62 and 64. The differential amplifier 60 compares the row address signal ADD_2NK, separating the block sets in two, with a reference voltage. The NAND gate ND1 generates the row address signal ADDX_2NK to be compressed in response to. a logic combination with a signal at output terminal NI of the differential amplifier 60 and the refresh command signal NK_REFRESHB. The NAND gate ND2 generates the row address signal ADDXB_2NK to be compressed in response to a logic combination with a signal at output terminal N2 (the complementary of N1) of the differential amplifier 60 and the refresh command signal NK_REFRESHB. The logic circuit 62 generates the NK refresh address signal ADDX_NK in response to a combinational operation with the signal at the output terminal N1 of the differential amplifier 60, the refresh command signal NK_REFRESHB, and the refresh command signal NK_REFRESHB. The logic circuit 64 generates the NK refresh address signal ADDXB_NK in response to a combinational operation with the signal at the output terminal N2 of the differential amplifier 60, the refresh command signal NK_REFRESHB, and the refresh staring signal REFRESH_REGUESTB.

The differential amplifier 60 includes PMOS transistors P1 and P2 connected between internal power supply voltage Vinti and the output terminal T1 in parallel, PMOS transistors P3 and P4 connected between Vinti and the output terminal T2 in parallel, NMOS transistors N1 and N2 whose drains are connected to T1, NMOS transistors N3 and N4 whose drains are connected to T2. The PMOS transistors P2 and P3 are cross-coupled from each other, and the NMOS transistors N2 and N3 are cross-coupled from each other. Gates of the PMOS and NMOS transistors, P2, N1, and N2, are coupled to T2, and gates of the PMOS and NMOS transistors, P3, N3, and N4 are coupled to T1. Sources of the NMOS transistors N2 and N3 are connected to internal substrate voltage (or a ground voltage) Vssi through NMOS transistor N5 whose gate responds to buffer starting signal BUF_STARTB through three inverters connected in serial. Source of the NMOS transistor N1 is connected to Vssi through NMOS transistors N8, N9, and N10.

Gate of the NMOS transistor N8 is coupled to the buffer starting signal BUF_STARTB through an inverter, together with gates of the PMOS transistors P1 and P4 and NMOS transistor N18 whose drain is connected to source of the NMOS transistor N4. Gates of the NMOS transistors are coupled to column address strobe signal CAS and the address signal ADD_2NK. Source of the NMOS transistor N18 is connected to Vssi through NMOS transistors N12 and N13 those are connected in serial, and also through NMOS transistors N14 and N15 those are connected in serial, in parallel. Gate of the NMOS transistor N12 is coupled to the row address strobe signal CAS through an inverter while the NMOS transistor N14 is coupled to CAS directly. Gate of the NMOS transistor N15 is coupled to reference voltage REF_VOLTAGE that is a half level of Vinti. Between the reference voltage REF_VOLTAGE and Vssi are connected MOS capacitors N16 and N17 in parallel.

The logic circuit 62 (or 64) is constructed of inverter I1 (or I2) converting the refresh command signal NK_REFRESHB into its reverse signal. and NAND gate ND3 (or ND4) receiving the output from the inverter I1 (or I2), the signal at the output terminal T1 (or T2) of the differential amplifier 60, and the refresh staring signal REFRESG_REQUESTB. The NAND gates ND3 and ND4 generates the address signal ADDX_NK (or ADDXB_NK).

In an operation of the first buffer shown in FIG. 4, when the refresh command signal NK_REFRESHB is at low level and the refresh starting signal REFRESH_REQUESTB is at high level (i.e., enabling an access process with double wordlines in the NK refresh mode), the row address signal ADD_2NK having a voltage level higher than the reference voltage REF_VOLTAGE makes the output terminal T1 be at low level while T2 be at high level. Thereby, the logic circuit 62 generates the address signal ADDX_NK with high level while the logic circuit 64 sets the ADDXB_NK on low level.

On the other hand, during the double wordline access in the NK refresh mode, if the row address signal ADD_2NK dividing the block sets in two sections has a current voltage level lower than the reference voltage REF_VOLTAGE, the output terminal T1 of the differential amplifier 60 is laid on high level while T2 is low level. Thus, the address signals ADDX_NK and ADDXB_NK are established to low and high levels each from the logic circuits 62 and 64, respectively.

The NK refresh address signal ADDX_NK with high level is provided to select the main wordlines MWL_L assigned to the left cell arrays 24a and 24b, while the NK refresh address signal ADDXB_NK with high level to select the main wordlines MWL_R of the right cell arrays 24c and 24d.

In this embodiment presented by the invention, the NK refresh mode is set into the double wordline access when the refresh starting signal REFRESH_REQUESTB is set on high level, while into a normal fashion with one wordline access when REFRESH_REQUESTB becomes low level.

In other words, the low-leveled refresh starting signal REFRESH_REQUESTB makes the NK refresh address signals ADDX_NK and ADDXB_NK from the NAND gates ND3 and ND4 be forced into all high levels, which enables all of the main wordlines regardless of left and right assignment to be activated.

And, in the condition of that the left cell array group of 24a and 24b of the block B is selected when the NK refresh address signal ADDX_NK is high level, the left main wordlines MWL_L are activated by each with the pitch of NK in accordance with cycles of the NK refresh modes. At this time, bitlines Bish_L and Bisl_L disposed in the left array region are conductive with the bitline sense amplifiers BL S/A, assigned to the cell arrays 24*a* and 24*b,* in accordance with the NK refresh cycles.

Figure 5:
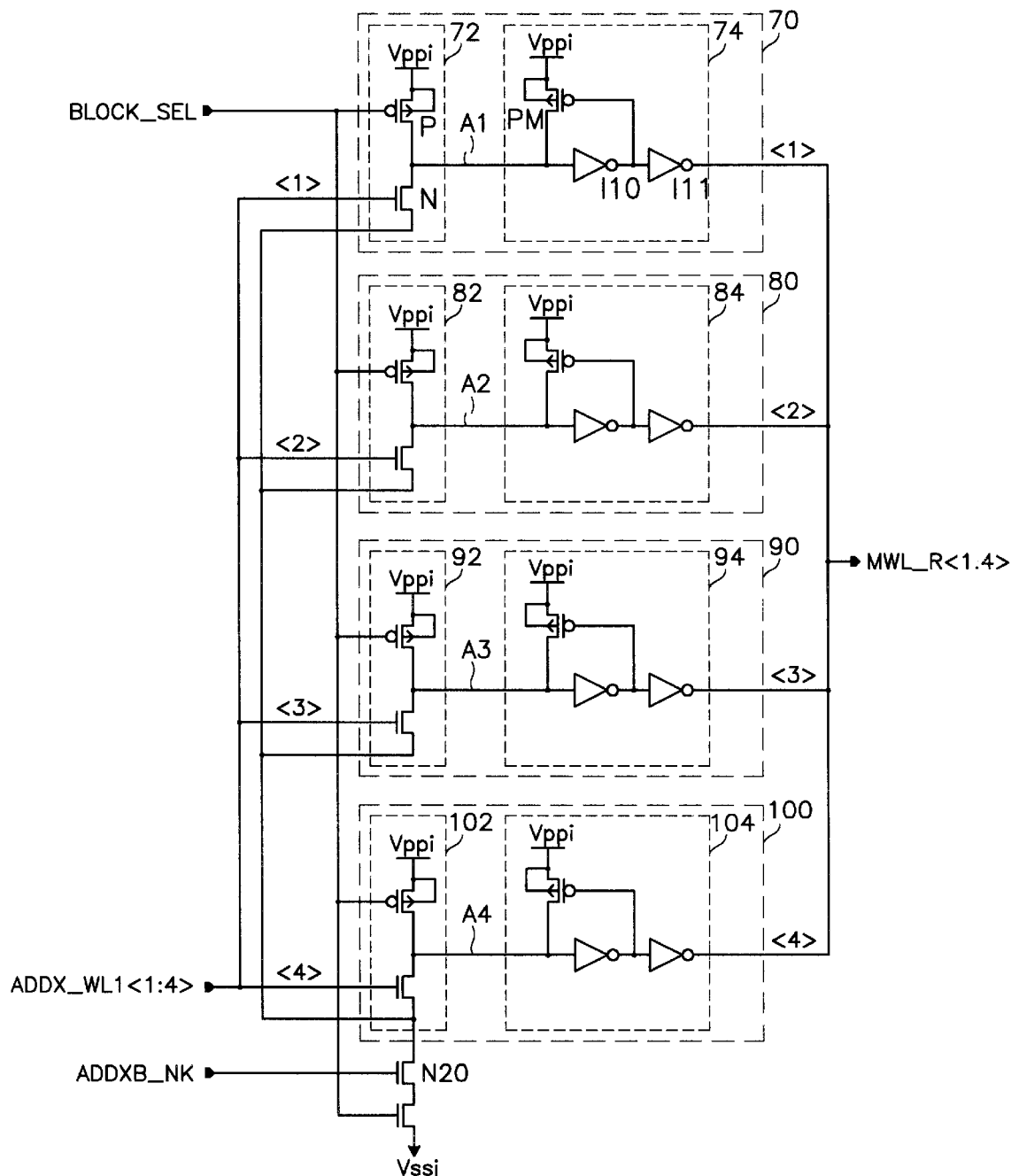
FIGS. 5 and 6 are circuit diagrams of the left and right main X-decoder shown in FIG. 3A, respectively.
Figure 6:
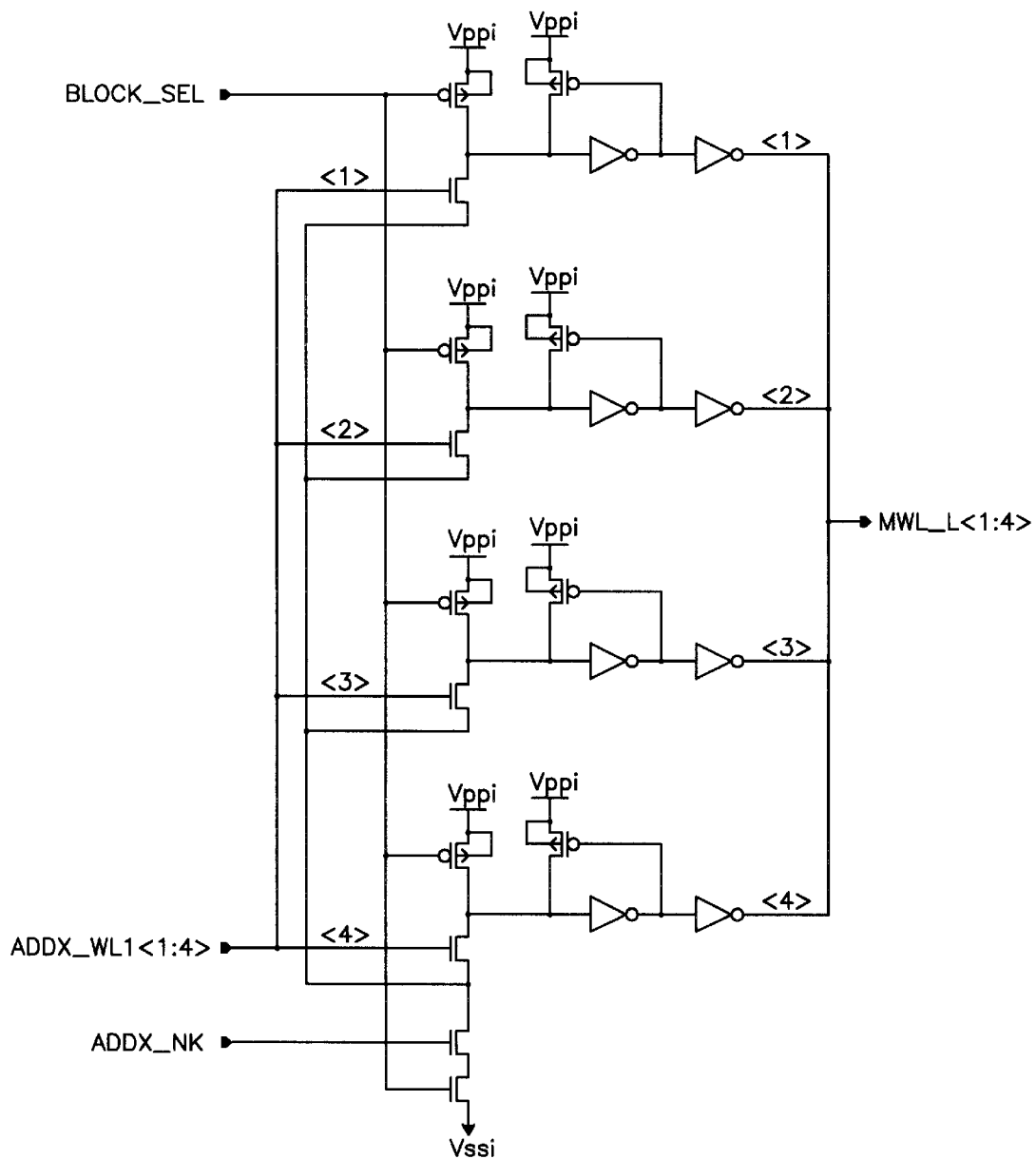

FIGS. 5 and 6 show circuit constructions of the main wordline divers MWLD_R and MWLD_L for activating the right and left main wordlines MWL_R and MWL_L those are arranged on the right and left groups of the cell arrays, 24*a* and 24*b,* and 24*c* and 24*d,* respectively.

Referring to FIG. 5., the right main wordline driver MWLD_R is conductive when the NK refresh address signal ADDXB_NK is supplied with high level from the logic circuit 64 thereto, and enables the right main wordlines MWL_R<1:4> (<1:4> means four main wordlines) in response to the wordline selection address signals ADDX_WL1<1:4>. The wordline selection address signals ADDX_WL1<1:4> (ADDX_WL1<1> through <4>) is applied to driver units 70, 80, 90, and 100, respectively, so that one of the driver units is activated by a corresponding one of the wordline selection address signals ADDX_WL1<1:4>. The driver units 70, 80, 90, and 100 are assigned to the right main wordlines MWL_R<1>, MWL_R<2>, MWL_R<3>, and MWL_R<4>, respectively, responding to the wordline selection address signals ADDX_WLI<1>, ADDX_WLI<2>, ADDX_WL1,<3>, and ADDX_WL1<4>.

A typical construction of the driver unit (e.g., 70; those units have the same circuit construction) is formed of precharge part 72 establishing a voltage level at output terminal A1 on a predetermined level in response to the internal block selection signal BLOCK_SEL and the internal wordline selection address signal ADDX_WL1<1>, and latch 74 holding a current signal level from the precharge part 72 to drive the corresponding main wordline MWL_R<1>.

The precharge part 72 is structured of PMOS transistor P connected between internal high voltage terminal Vppi and the output terminal A1, and NMOS transistor N connected between Al and drain of NMOS transistor N20 whose gate is coupled to the NK refresh address signal ADDXB_NK. Gate of the PMOS transistor P is coupled to the block selection signal BLOCK_SEL. and gate of the NMOS transistor N is coupled to the wordline selection address signal ADDX_WL1<1>. The latch 74 is formed of PMOS transistor PM connected between Vppi and A1, inverters I10 and I11 connected between A1 and MWL_R<1> in serial. Gate of the PMOS transistor PM is coupled to a node between the inverters I10 and I11. The Vppi is higher than Vinti.

The left main wordline driver MWLD_L shown in FIG. 6. for activating the left main wordlines MWL_L assigned to the left cell arrays 24*a* and 24*b* of the block B. is conductive when the NK refresh address signal ADDX_NK is set on high level and responds to the wordline selection address signals ADDX WL1<1:4>. The circuit construction is the same with that of the right main wordline driver MWLD_L shown in FIG. 5.

As described above, since the invention can provide a data processing feature of a NK refresh mode, even after preparing the refresh modes for 2NK and NK wordlines at the same time, where an alternative one of the left and right cell arrays is activated with using the NK refresh address signals not to be compressed (i.e., not to render them to be invalid), it is possible to reduce the number of the wordlines being conductive during the NK refresh mode into a half of that for the 2NK refresh modes.

The smaller number of the wordlines causes the number of memory cells selected and then contributes to enhance the speed for progressing the data read-out/write-in operations, accompanying with a reducing of current consumption thereof.

Although specific constructions and procedures of the invention have been illustrated and described herein, it is not intended that the invention is limited to the elements and constructions disclosed. One skilled in the art would easily recognize that the particular elements or sub-construction may be used without departing from the scope and spirit of the invention.

What is claimed is:

1. A semiconductor memory device comprising:
   a block set having a plurality of cell array blocks which each is divided into a plurality of regions which employ wordlines independently from each other;
   row driving means to alternatively select the wordlines arranged each in the regions, the row driving means comprising a first buffer for generating compressed row address signals and NK refresh address signals in response to control signals and row address signals corresponding to two-grouped wordlines wherein N is an integer and K is the number of wordlines of a cell array, a block selection circuit for selecting an alternative one of the cell array blocks in response to a block selection address signal and the compressed row address signals, a second buffer for buffering and decoding wordline selection address signals, and a wordline selection circuit for activating an alternative one of the wordlines of the selected cell array block in response to the NK refresh address signals, the block selection address signal assigned to the selected cell array block, and the decoded wordline selection address signal; and
   column driving means to activate columns of the cell array blocks involved in the wordlines selected by the row driving means.

2. The semiconductor memory device of claim 1, wherein each of the cell array blocks has two groups of the wordlines.

3. The semiconductor memory device of claim 2, wherein the first buffer comprises:
   a differential amplifier for comparing a row address signal corresponding to one of the wordlines with a reference voltage;
   a first combination logic for generating one of the compressed row address signals in response to a refresh command signal and a first output signal of the differential amplifier;
   a second combination logic for generating the other of the compressed row address signals in response to the refresh command signal and a second output signal of the differential amplifier;
   a third combination logic for generating one of the NK refresh address signals in response to the refresh command signal, a refresh starting signal, and the first output signal of the differential amplifier; and
   a fourth combination logic for generating the other of the NK refresh address signals in response to the refresh command signal, the refresh starting signal, and the second output signal of the differential amplifier.

4. The semiconductor memory device of claim 3, wherein the first combination logic is formed of a NAND gate.

5. The semiconductor memory device of claim 3, wherein the second combination logic is formed of a NAND gate.

6. The semiconductor memory device of claim 3, wherein the third combination logic comprises:
   an inverter for converting the refresh command signal into a reverse signal thereof; and a NAND gate receiving an output signal from the inverter, the refresh starting signal, and the first output signal from the differential amplifier.

7. The semiconductor memory device of claim 3, wherein the fourth combination logic comprises:

an inverter for converting the refresh command signal into a reverse signal thereof; and a NAND gate receiving an output signal from the inverter, the refresh starting signal, and the first output signal from the differential amplifier.

8. The semiconductor memory device of claim 2, wherein the wordline selection circuit includes a plurality of units for driving an alternative one of the wordlines of the selected cell array block in response to the decoded wordline selection address signal and the block selection address signal corresponding to the selected cell array block.

9. The semiconductor memory device of claim 8, wherein each of the units comprises:

a precharging part for establishing a voltage level of an output terminal on a predetermined level in response to the decoded wordline selection address signal and the block address signal corresponding to the selected cell array block; and a latch for holding an output from the precharging part to drive one of the wordlines.

10. The semiconductor memory device of claim 2, wherein the column driving means comprises:

means to generate a decoded column address signal adaptable to a wordline of the selected cell array block in response to column address signals and a refresh command signal; and means to generate a column enable signal adaptable to the wordline of the selected cell array block in response to the NK refresh address signals and the decoded column address signal.

* * * * *